(12) United States Patent
Yang et al.

(10) Patent No.: US 11,696,435 B2
(45) Date of Patent: Jul. 4, 2023

(54) SEMICONDUCTOR MEMORY STRUCTURE AND METHOD FOR FORMING THE SAME

(71) Applicant: Winbond Electronics Corp., Taichung (TW)

(72) Inventors: Jiun-Sheng Yang, Taichung (TW); Hsing-Hao Chen, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/402,087

(22) Filed: Aug. 13, 2021

(65) Prior Publication Data

US 2022/0223599 A1 Jul. 14, 2022

(30) Foreign Application Priority Data

Jan. 8, 2021 (TW) ................................. 110100824

(51) Int. Cl.
*H01B 12/00* (2006.01)
*H10B 12/00* (2023.01)

(52) U.S. Cl.
CPC ......... *H10B 12/315* (2023.02); *H10B 12/482* (2023.02); *H10B 12/488* (2023.02)

(58) Field of Classification Search
None
See application file for complete search history.

(56) References Cited

U.S. PATENT DOCUMENTS

| 8,648,414 | B2 | 2/2014 | Tang | |
|---|---|---|---|---|
| 2009/0004862 | A1* | 1/2009 | Kim | H01L 21/0337 |
| | | | | 438/692 |
| 2015/0333069 | A1 | 11/2015 | Kim et al. | |
| 2016/0005833 | A1* | 1/2016 | Collins | H01L 29/66795 |
| | | | | 257/288 |
| 2018/0226406 | A1 | 8/2018 | Surthi | |
| 2021/0296237 | A1* | 9/2021 | Kim | H01L 27/10855 |

FOREIGN PATENT DOCUMENTS

TW I-690055 B 4/2020

OTHER PUBLICATIONS

Office Action dated Sep. 2, 2021 in TW application No. 110100824, 7 pages.

* cited by examiner

*Primary Examiner* — Mohammad M Hoque
*Assistant Examiner* — Kevin Quinto
(74) *Attorney, Agent, or Firm* — Muncy, Geissler, Olds & Lowe, P.C.

(57) ABSTRACT

A method for forming a semiconductor memory structure includes providing a semiconductor substrate; forming a hard mask layer on the semiconductor substrate; forming a contact opening corresponding to the pair of word lines through the hard mask layer and a portion of the semiconductor substrate; forming a pair of spacers on sidewalls of the contact opening; filling the contact opening with a conductive material to form a contact; forming a bit line directly above the contact and the pair of spacers, and forming a dielectric liner on sidewalls of the bit line. The pair of word lines is embedded in an active region of the semiconductor substrate and extends in a first direction. The bit line extends in a second direction. The first direction is perpendicular to the second direction.

18 Claims, 10 Drawing Sheets

SEMICONDUCTOR MEMORY STRUCTURE AND METHOD FOR FORMING THE SAME

CROSS REFERENCE TO RELATED APPLICATIONS

This application claims priority of Taiwan Patent Application No. 110100824, filed on Jan. 8, 2021, the entirety of which is incorporated by reference herein.

BACKGROUND

Technical Field

The present disclosure relates to semiconductor memory structure, and particularly it relates to dynamic random-access memory and methods for forming the same.

Description of the Related Art

In recent years, dynamic random access memory (DRAM) is widely used in consumer electronic products. In order to increase the density of elements in dynamic random access memory and improve the entire performance, the fabrication technique of the current dynamic random access memory continues to work toward scaling down of the elements.

However, as the elements continue to shrink, many challenges arise. For example, in the semiconductor fabrication process, in order to prevent the bit line contact from contacting the subsequent capacitor contact, which may cause a short-circuit, a nitride is generally disposed near the contact. However, the upper bit line structure is likely to be damaged by the use of etchants (such as phosphoric acid) during the process of patterning the nitride. Therefore, it still needs to improve the method for fabricating dynamic random access memory to overcome the problems caused by scaling down the elements.

BRIEF SUMMARY

In accordance with some embodiments of the present disclosure, a method for forming a semiconductor memory structure is provided. The semiconductor memory structure includes providing a semiconductor substrate; forming a hard mask layer on the semiconductor substrate; forming a contact opening corresponding to the pair of word lines through the hard mask layer and a portion of the semiconductor substrate; forming a pair of spacers on sidewalls of the contact opening; filling the contact opening with a conductive material to form a contact; forming a bit line directly above the contact and the pair of spacers, and forming a dielectric liner on sidewalls of the bit line. The pair of word lines is embedded in an active region of the semiconductor substrate, and extends in a first direction. The bit line extends in a second direction. The first direction is perpendicular to the second direction.

In accordance with some embodiments of the present disclosure, a semiconductor memory structure is provided. The semiconductor memory structure includes a semiconductor substrate having an active region, a pair of word lines embedded in the active region of the semiconductor substrate, a cap layer disposed on the semiconductor substrate, a contact penetrating through the cap layer, a pair of spacers disposed on sidewalls of the contact, a bit line extending in a second direction that is perpendicular to the first direction, and a dielectric liner disposed on sidewalls of the bit line. The pair of word lines extends in a first direction. A portion of the contact is disposed in the semiconductor substrate. The pair of spacers corresponds to the pair of word lines. In a cross-section taken along the first direction, the bit line is disposed directly above the contact and the pair of spacers.

BRIEF DESCRIPTION OF THE DRAWINGS

FIGS. 2A-7A, 2B-7B, 9A-20A and 9B-20B illustrate cross-sectional views of semiconductor memory structures at various stages according to some embodiments of the present disclosure.

DETAILED DESCRIPTION

Figure 1:
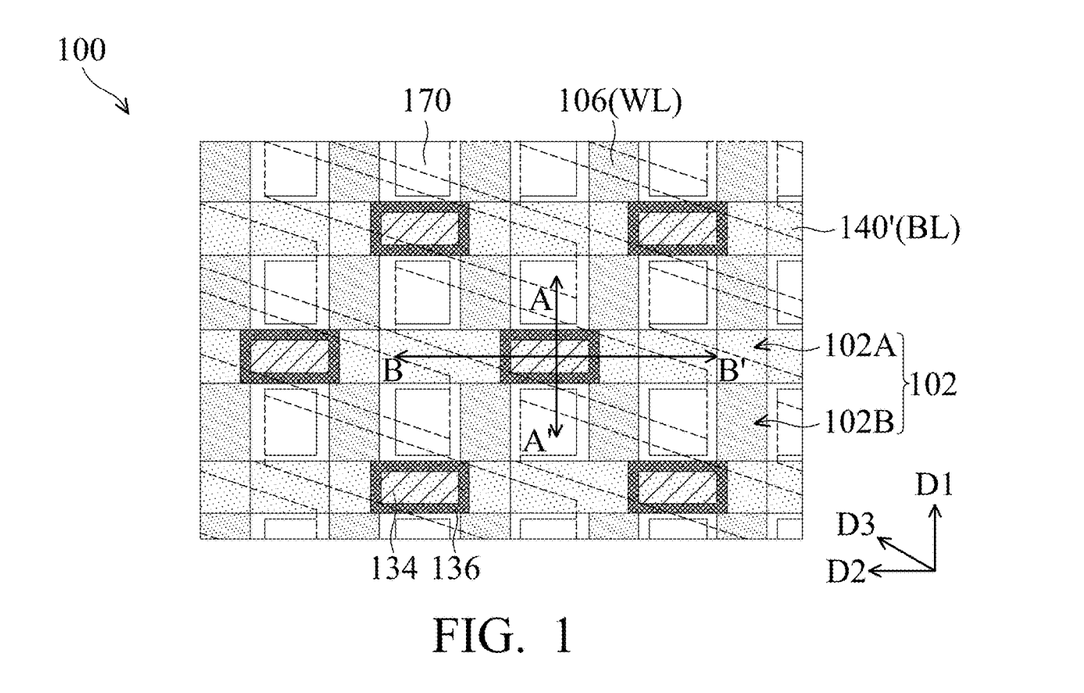
FIGS. 1 and 8 illustrate top views of a semiconductor memory structure according to some embodiments of the present disclosure.

FIG. 1 illustrates a top view of a semiconductor memory structure 100 according to some embodiments of the present disclosure. The semiconductor memory structure 100 is a portion of dynamic random access memory array. The semiconductor memory structure 100 includes a semiconductor substrate 102, word lines 106, a contact 134, spacers 136, a bit line 140', a capacitor contact 170. The semiconductor substrate 102 includes an active region 102A and an isolation region 102B, the word lines 106 extend in the first direction D1, the bit line 140' extends in the second direction D2, and the active region 102A extends in the third direction D3. The first direction D1 is perpendicular to the second direction D2, and the third direction D3 (that is, the extending direction of the active area 102A) and the second direction D2 form an angle of about 10°-40° (e.g. 20°, so as to increase the degree of integration of the components.

It should be noted that only some of the elements of a dynamic random access memory are illustrated in FIG. 1, for brevity. Cross-sectional views in subsequent figures are illustrated along the cross-sectional lines A-A' and B-B' shown in FIG. 1, which is beneficial to describing the method for forming the semiconductor memory structure.

FIGS. 2A-7A and FIGS. 2B-7B illustrate cross-sectional views of semiconductor memory structures at various stages according to some embodiments of the present disclosure that are taken along the cross-sectional lines A-A' (the first direction D1) and B-B' (the second direction D2) in FIG. 1, respectively. They may also be referred to the cross-sectional view of the first direction and the cross-sectional view of the second direction, respectively.

It should be noted that in cross-sectional views along cross-sectional lines A-A' and B-B', the horizontal direction may be the first direction D1 and the second direction D2 in FIG. 1, respectively, and the vertical direction may both be a direction Z.

Figure 2A:
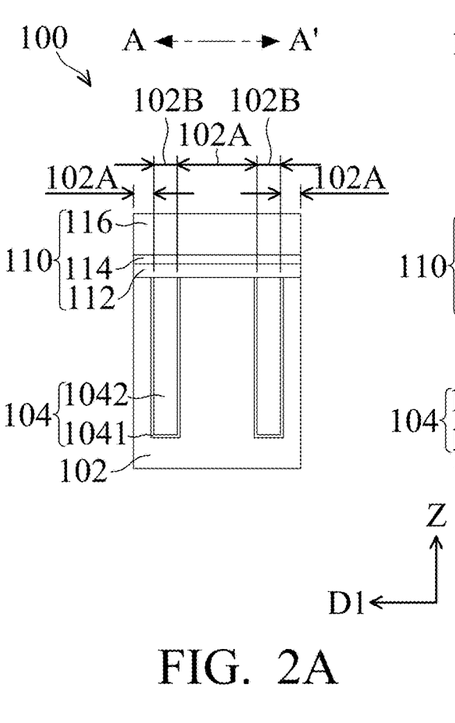
Figure 2B:
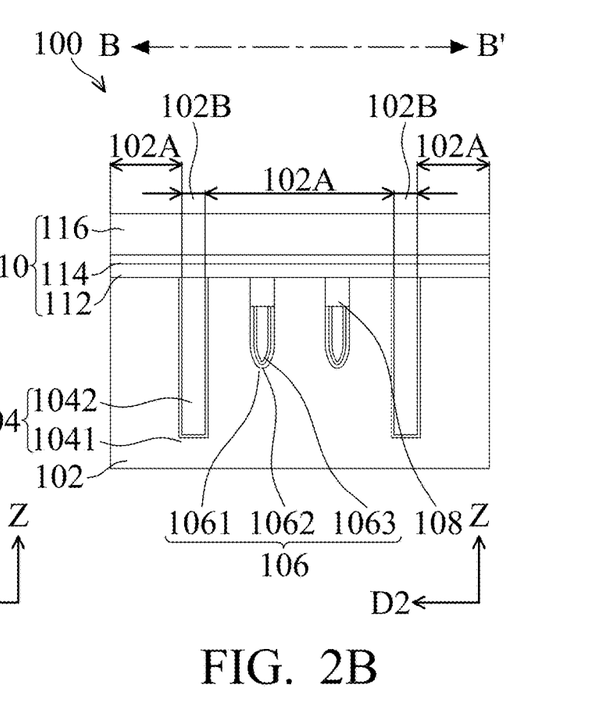

As shown in FIG. 2A and FIG. 2B, the semiconductor substrate 102 is provided. The semiconductor substrate 102 may be an elemental semiconductor substrate, such as a silicon substrate or a germanium substrate; a compound semiconductor substrate, such as a silicon carbide substrate or a gallium arsenide substrate, or the like. In some embodiments, the semiconductor substrate 102 may be a semiconductor-on-insulator (SOI) substrate.

The semiconductor substrate 102 includes the active region 102A and the isolation region 102B surrounding the active region 102A. An isolation feature 104, which includes an isolation liner 1041 and an isolation filler 1042, is disposed in the isolation region 102B of the semiconductor substrate 102. For simplifying the drawing, the reference numbers of the active region 102A and the isolation region 102B are omitted in the subsequent cross-sectional views.

The isolation liner 1041 and the isolation filler 1042 may include nitride or oxide, such as silicon oxide (SiO), silicon nitride (SiN), silicon oxynitride (SiON), and/or a combination thereof.

As shown in FIG. 2B, in the active region 102A, a pair of word lines 106 and a protective layer 108 thereon are embedded in the semiconductor substrate 102. The pair of word lines 106 is disposed beside the isolation feature 104 without contacting the isolation feature 104. It should be noted that since the word lines 106 extend in the first direction D1 and do not contact the cross-sectional line A-A' in FIG. 1, the word lines 106 are not shown in FIG. 2A.

Word lines 106 act as a gate, which include a gate dielectric layer 1061, a gate liner 1062, and a gate electrode 1063.

A trench (not shown) is first formed by a patterning process, and the gate dielectric layer 1061 is formed in the trench. The gate dielectric layer 1061 includes silicon oxide, silicon nitride, silicon oxynitride, or high-k dielectric materials.

A gate liner 1062 is formed on the gate dielectric layer 1061. The gate liner 1062 includes tungsten nitride (WN), titanium nitride (TiN), or tantalum nitride (TaN).

The gate electrode 1063 is formed on the gate liner 1062. The gate electrode 1063 is formed by a conductive material, for example, doped polysilicon, metal, or metal nitride.

After depositing materials for the gate dielectric layer 1061, the gate liner 1062, and the gate electrode 1063, the gate liner 1062 and the gate electrode 1063 are etched back so that the gate dielectric layer 1061, the gate liner 1062, and the gate electrode 1063 become the word line 106. The above-mentioned etch back makes the word line 106 lower than the top surface of the semiconductor substrate 102 so as to form the protective layer 108 on the word line 106 subsequently.

The protective layer 108 is formed on the top surfaces of the gate dielectric layer 1061, the gate liner layer 1062, and the gate electrode 1063. The protective layer 108 includes silicon nitride, which may be used as a gate dielectric layer to control the channel. The formation of the protective layer 108 includes first using a deposition process to deposit nitride on the word line 106, and then using an etch-back process to remove the nitride on the semiconductor substrate 102. The top surface of the remaining nitride is level with the top surface of the semiconductor substrate 102.

Next, as shown in FIGS. 2A and 2B, a hard mask layer 110 is formed on the semiconductor substrate 102 and the protective layer 108. The hard mask layer 110 includes a first oxide layer 112, a nitride layer 114 and a second oxide layer 116.

The first oxide layer 112 and the second oxide layer 116 include silicon oxide layers formed of tetraethylorthosilicate (TEOS). In some embodiments, the nitride layer 114 includes silicon nitride (SiN) or silicon oxynitride (SiON).

The second oxide layer 116 has a thicker thickness than the first oxide layer 112 to prevent subsequent processes from affecting or damaging the nitride layer 114 disposed therebetween.

Figures 3A, 3B:
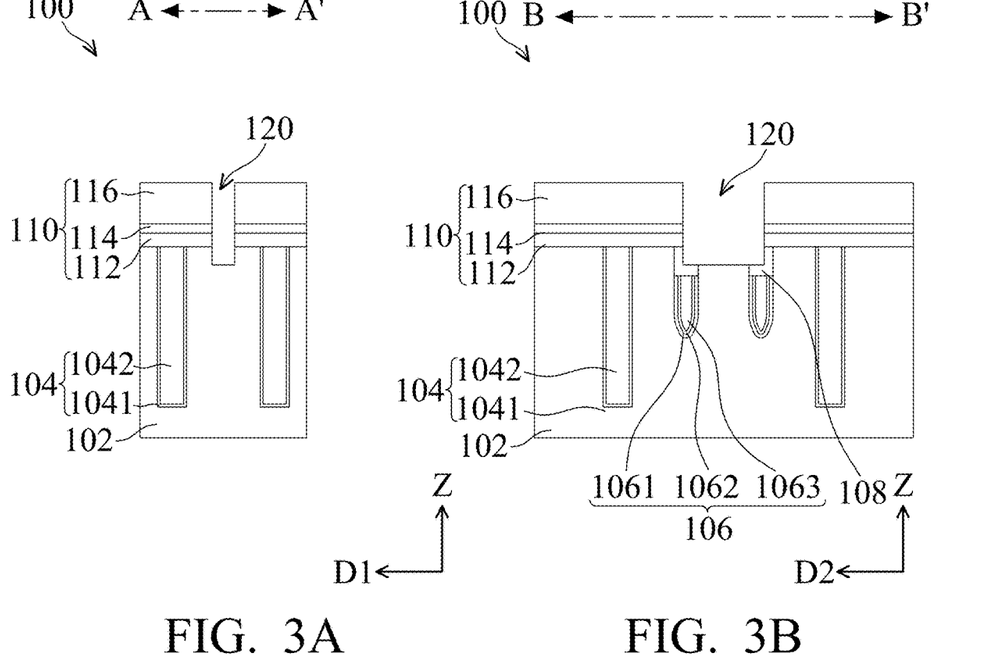

Next, as shown in FIGS. 3A and 3B, a contact opening 120 is formed between the isolation features 104, wherein the contact opening 120 penetrates through the hard mask layer 110 and a portion of the semiconductor substrate 102. In FIG. 3B, the contact opening 120 corresponds to a pair of word lines 106 and penetrates through a portion of the protective layer 108 but does not contact the word lines 106 to avoid leaking current when the threshold voltage is increased.

One side edge of the contact opening 120 is disposed between the two edges of one word line, and the other side edge of the contact opening 120 is also disposed between the two edges of the other word line. When the side edge of the contact opening 120 extends beyond the word line 106 and extends toward the isolation feature 104, subsequently formed contact is likely to directly contact the active region 102A thereby leading to current leakage. When the side edge of the contact opening 120 is disposed between the word lines 106 without contacting the word lines 106, a larger contact resistance is likely to occur due to smaller contact area of the subsequently formed contact.

Figures 4A, 4B:
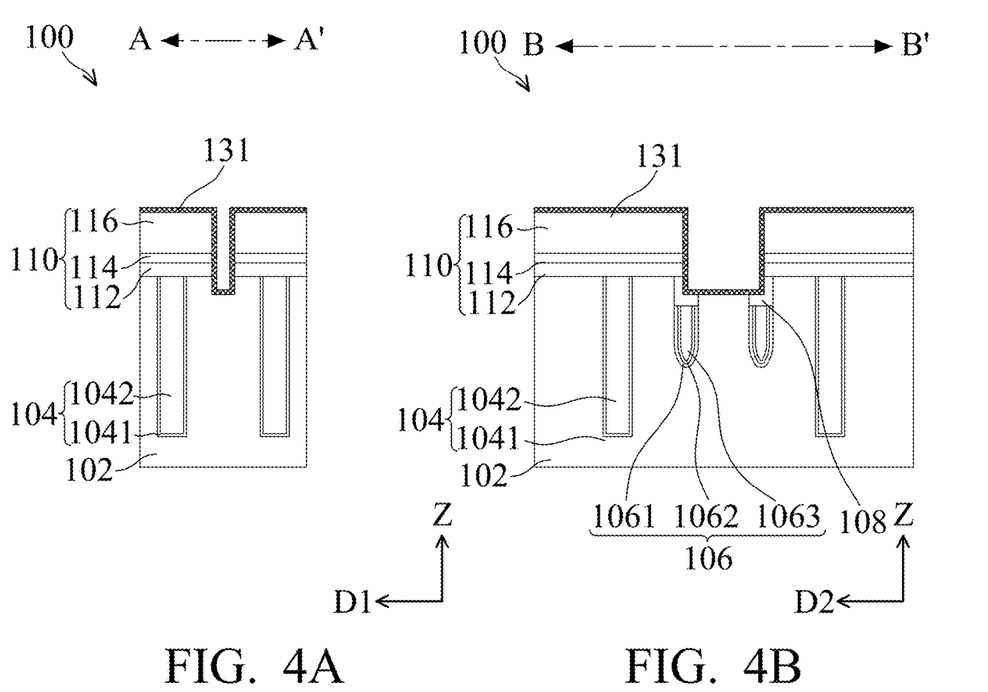

Next, as shown in FIGS. 4A and 4B, a spacer material layer 131 is formed on the contact opening 120 and the hard mask layer 110. The spacer material layer includes a dielectric material including nitride or oxide.

Figures 5A, 5B:
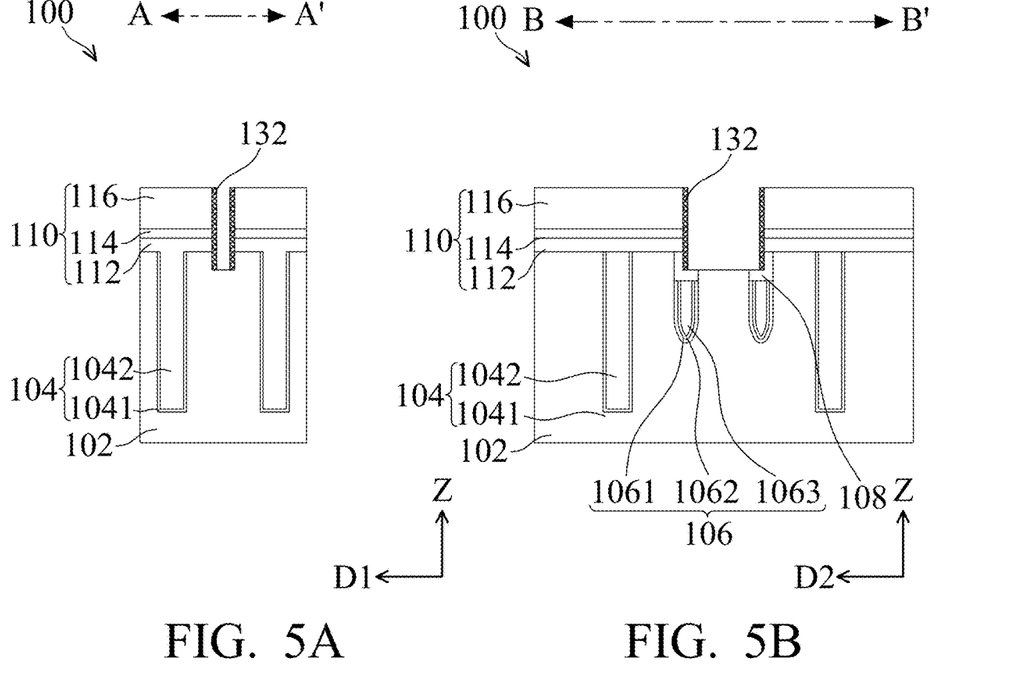

As shown in FIGS. 5A and 5B, the spacer material layer 131 on the bottom of the contact opening 120 and on the hard mask layer 110 is removed, the spacer material layer 131 remaining on the sidewall of the contact opening 120 serves as a pair of spacers 132.

Figures 6A, 6B:
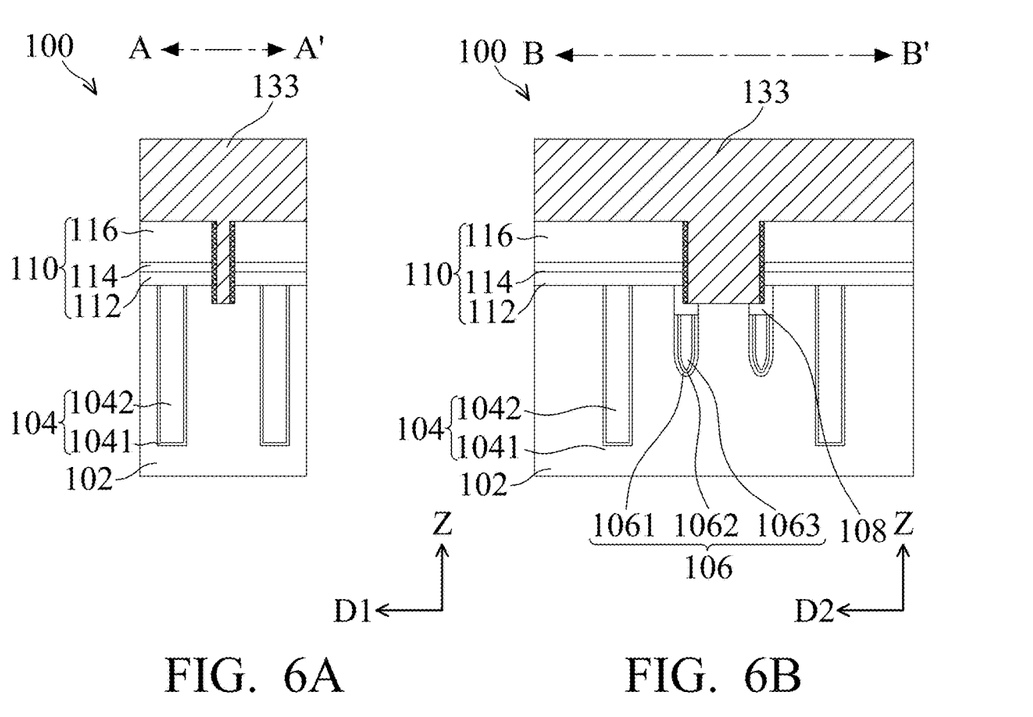

Next, as shown in FIGS. 6A and 6B, a conductive material 133 is formed on the bottom of the contact opening 120, the spacer 132, and the hard mask layer 110. The conductive material 133 includes doped polysilicon, metal, or metal nitride.

The conductive material 133 is formed of polysilicon with dopants to reduce the contact resistance with the bit line formed subsequently. The dopants may include n-type or p-type dopants, such as nitrogen, arsenic, phosphorous, antimony ions or boron, aluminum, gallium, indium, and boron trifluoride ions ($BF^{3+}$).

Figures 7A, 7B:
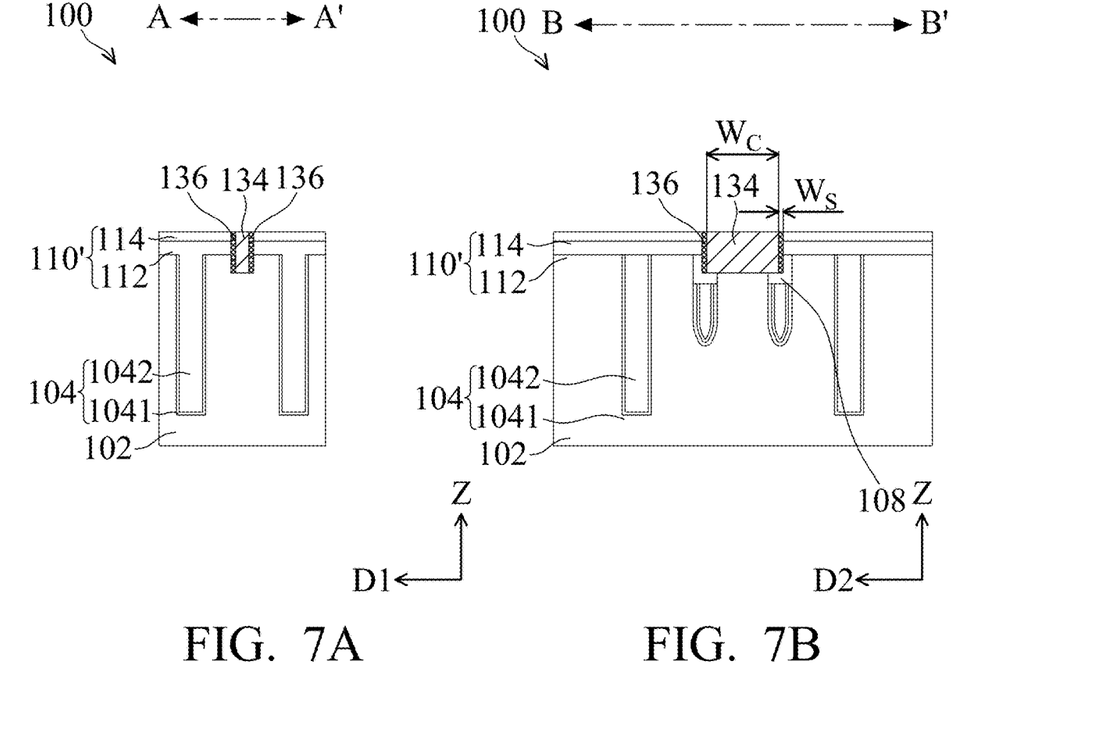

Next, as shown in FIGS. 7A and 7B, a portion of the hard mask layer 110, conductive material 133 and spacers 132 are removed, and the remaining hard mask layer 110 serves as a cap layer 110', and the remaining conductive material 133 serves as a contact 134, and the remaining spacers 132 serve as spacers 136. Specifically, the second oxide layer 116, the conductive material 133 and the spacer 132 on the nitride layer 114 are removed, so that the remaining nitride layer 114, the remaining conductive material 133 and the remaining spacer 132 are coplanar. In FIGS. 7A and 7B, the top surfaces of the cap layer 110', the spacers 136 and the contact 134 are level with each other.

Since the contact opening 120 in FIG. 3A (the cross-sectional view along the first direction D1) is disposed in the active region 102A between the isolation features 104, the spacers 136 in FIG. 7A is also disposed in the active region 102A between the isolation features 104 without extending over the isolation region 102B. In addition, in FIG. 7A, the contact 134 is laterally spaced from the active region 102A in the semiconductor substrate 102 by the pair of spacers 136 to avoid current leakage.

Since one edge side of the contact opening 120 in FIG. 3B (the cross-sectional view along the second direction D2) is disposed between the two edges of one word line 106, the spacer 136 in FIG. 7B is also disposed between the two edges of one word line 106 without extending beyond the edges of the word line 106. In addition, in FIG. 7B, the spacer 136 is disposed directly above the word line 106 and the spacer 136 corresponds to the word line 106. Specifically, along the vertical direction Z, the spacer 136 is spaced from the word line 106 by the protective layer 108.

The ratio of the width We of the contact 134 to the width Ws of the spacer 136 is about 2-10. When the ratio is less than 2, the contact area of the contact 134 is too small due to the thicker spacer 136, which is likely to increase the contact resistance. When the ratio is greater than 10, the contact 134 is too close to the subsequent capacitor contact (not shown here) due to the thinner spacer 136, which is likely to cause a short circuit.

Now, returning to FIG. 1, the contact 134 and the spacer 136 surrounding the contact 134 may be formed by the process mentioned above. That is, the spacer 136 is disposed on the entirety of the sidewalls of the contact. Since in FIGS. 4A and 4B, the spacer material layer 131 is formed on the contact openings 120 in the first direction D1 and the second direction D2 at the same time, the thickness of the spacer 136 in the first direction D1 is the same as the thickness of the spacer 136 in the second direction D2.

Figure 8:
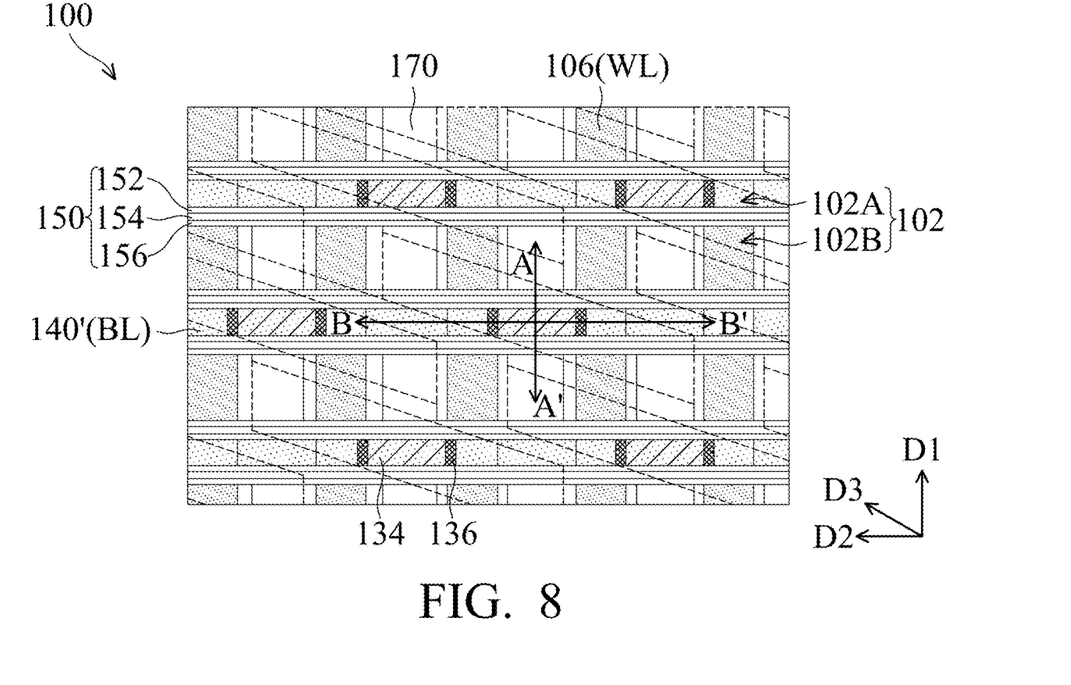

Next, referring to FIG. 8, which illustrates a top view of the semiconductor memory structure 100 according to some embodiments of the present disclosure. Continued from FIG. 1, FIG. 8 illustrates the relative positions of a dielectric liner 150, the contact 134, the spacer 136, and the capacitor contact 170 after the subsequent formation of the dielectric liner 150. It should be noted that FIG. 8 only illustrates some elements of a dynamic random access memory (DRAM) to simplify the figures. The subsequent figures are cross-sectionals along the cross-sectional lines A-A' and B-B' in FIG. 8 to be beneficial to describing the method for forming the semiconductor memory structure.

FIGS. 9A-20A and FIGS. 9B-20B continued from FIGS. 2A-7A and 2B-7B illustrate cross-sectional views of semiconductor memory structure 100 at various stages according to some embodiments of the present disclosure that are taken along the cross-sectional lines A-A' (the first direction D1) and B-B' (the second direction D2) in FIG. 1, respectively. They may also be referred to the cross-sectional view of the first direction and the cross-sectional view of the second direction, respectively.

Figures 9A, 9B:
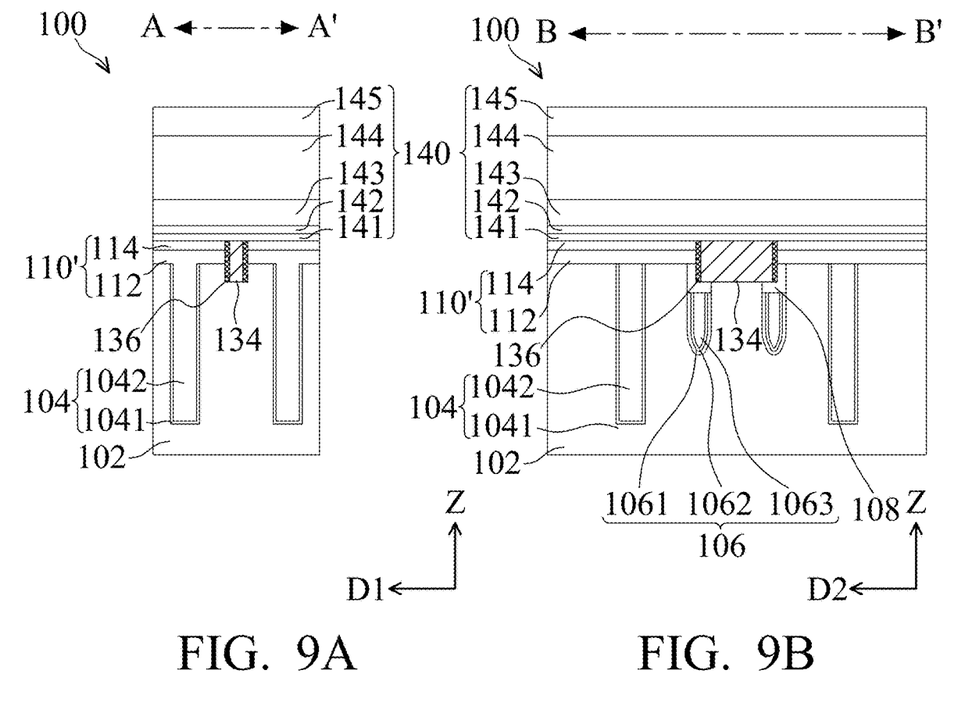

Continued from FIGS. 7A and 7B, as shown in FIGS. 9A and 9B, a bit line stack layer 140 is formed on the cap layer 110'. The bit line stack layer 140 includes conductive layers 141 and 142 and dielectric layers 143, 144 and 145. The conductive layers 141 and 142 include doped polysilicon, metal, or metal nitride, such as tungsten (W), titanium (Ti), and titanium nitride (TiN). The dielectric layers 143, 144, and 145 include nitride or oxide, such as silicon nitride or silicon oxide.

In a specific embodiment, the uppermost dielectric layer 145 is silicon oxide, and the other dielectric layers 143 and 144 are silicon nitride to prevent underlying film layers (such as conductive layers 141 and 142) from being damaged.

Figures 10A, 10B:
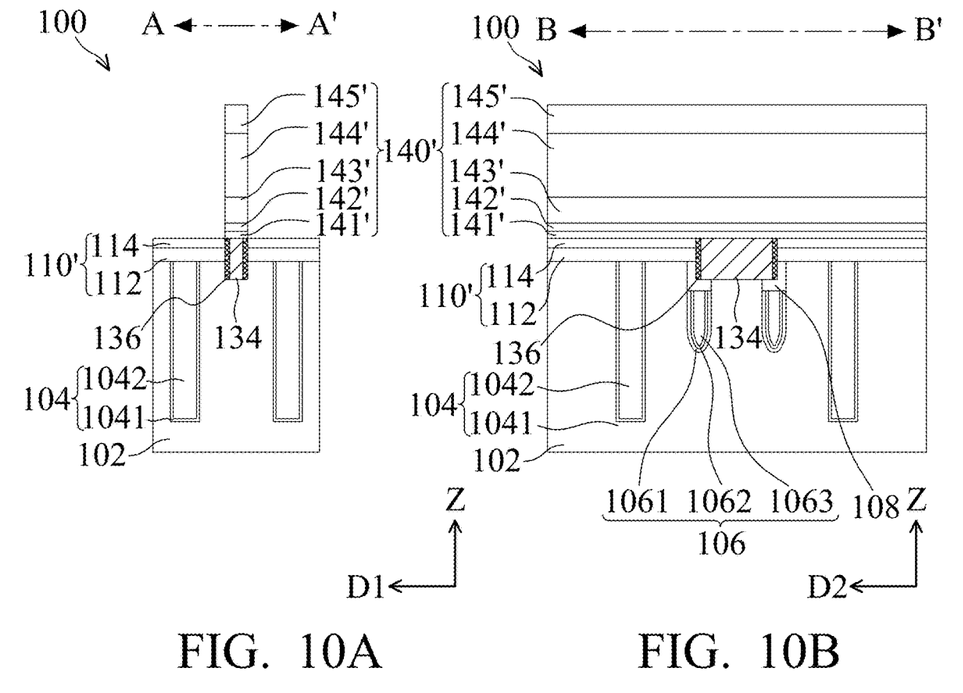
Figure 11A:
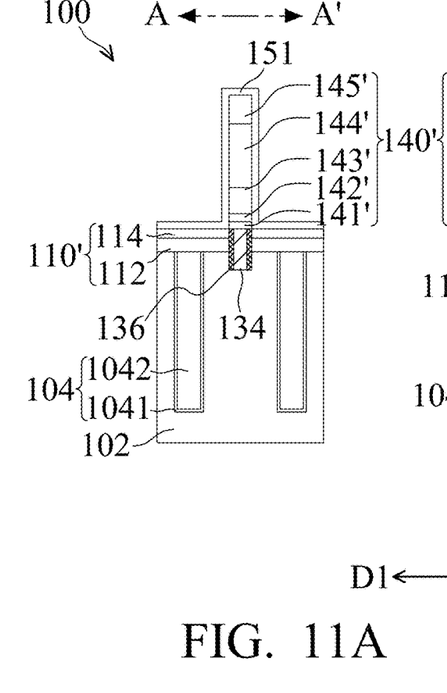
Figure 11B:
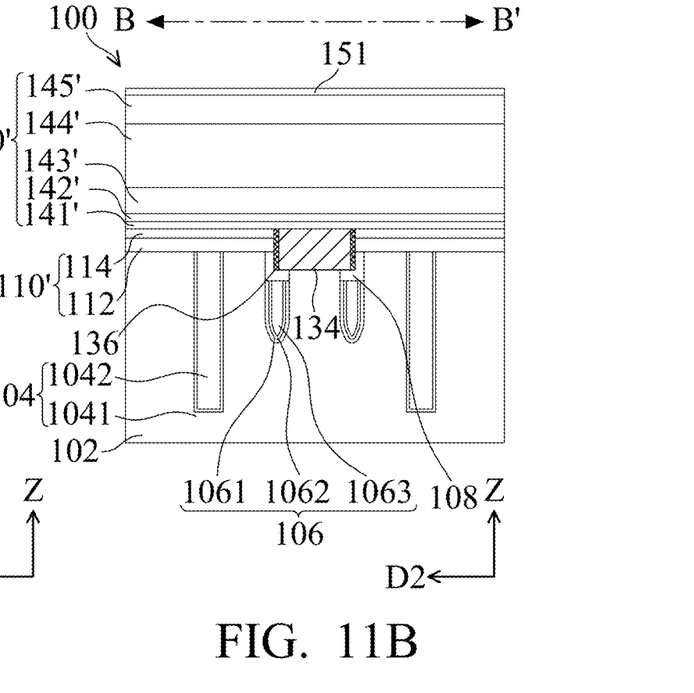
Figure 12A:
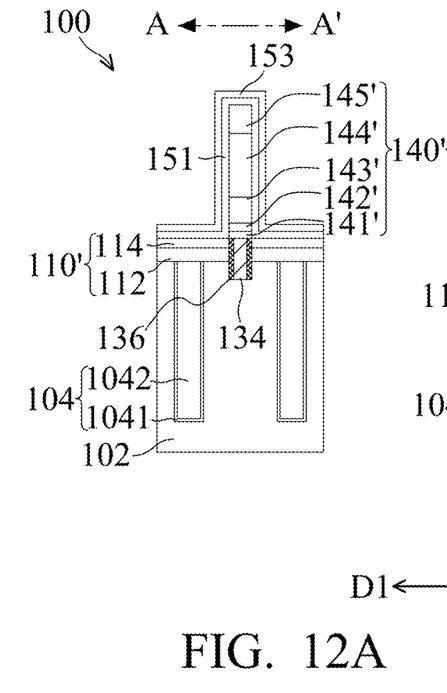
Figure 12B:
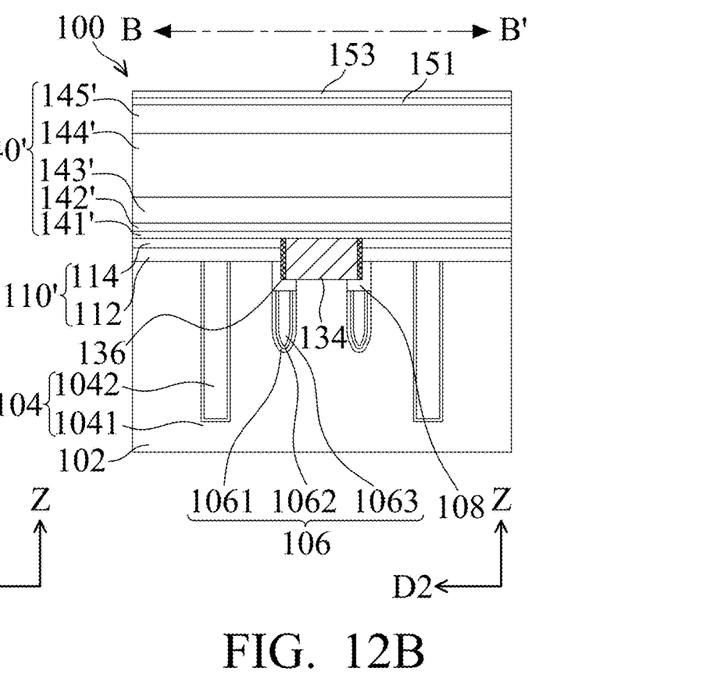

Next, as shown in FIGS. 10A and 10B, the bit line stack 140 is patterned by a patterning process to form a bit line 140'. Specifically, the conductive layers 141 and 142 and the dielectric layers 143, 144, and 145 in the bit line stack layer 140 are etched to form the conductive patterns 141' and 142' and the dielectric patterns 143', 144', and 145'.

Next, referring to FIGS. 11A-14A and 11B-14B, a dielectric liner 150 (shown in FIG. 14A) is formed on the cap layer 110' and the bit line 140' to isolate the bit line 140' from the subsequent capacitor contacts.

First, in FIGS. 11A-12A and 11B-12B, a deposition process is used to first conformally deposit a nitride material liner 151 on the top surface of the cap layer 110' and on the sidewalls and the top surface of the bit line 140', and then a deposition process is used to conformally deposit an oxide material liner layer 153 on the nitride material liner layer 151.

Figures 13A, 13B:
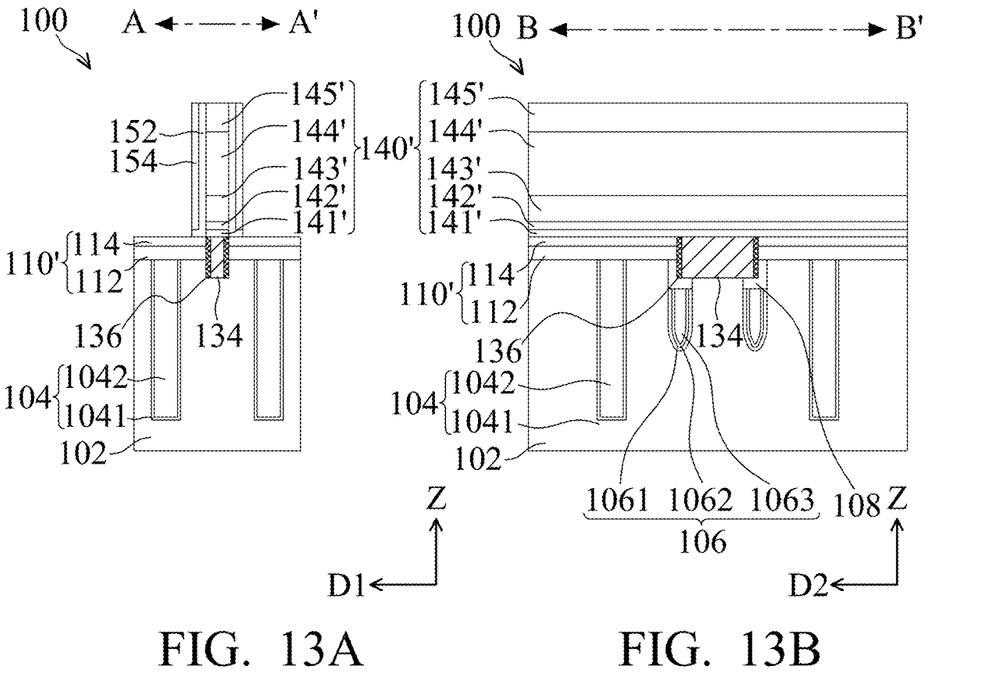

Next, in FIG. 13A, the nitride material liner layer 151 and the oxide material liner layer 153 are etched back, so that the remaining nitride material liner layer 151 and the remaining oxide material liner layer 153 may serve as the nitride liner layer 152 and the oxide liner 154, respectively. The top surfaces of the nitride liner layer 152 and the oxide liner layer 154 are level with the top surface of the bit line 140'. In FIG. 13B, the nitride material liner layer 151 and the oxide material liner layer 153 are removed, leaving the bit line 140' only.

Figures 14A, 14B:
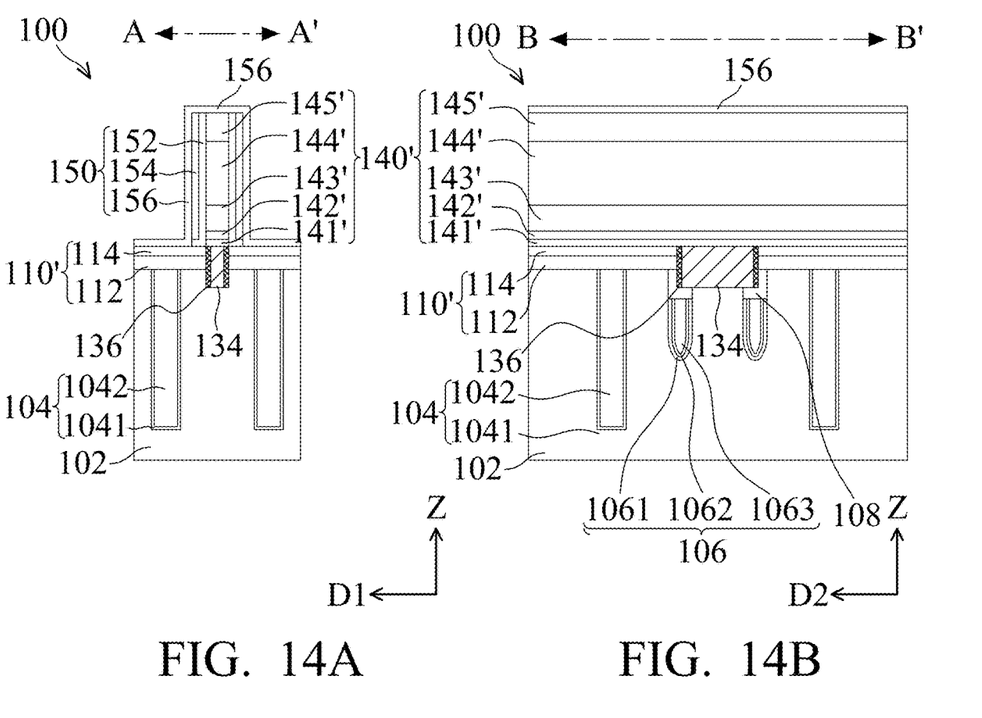

Thereafter, in FIGS. 14A and 14B, a nitride liner layer 156 is conformally deposited on the nitride liner layer 152, the oxide liner layer 154, and the bit line 140' using a deposition process.

It should be noted that in FIG. 14A, as the bit line 140' is centered, the nitride liner layer 152, the oxide liner layer 154, and the nitride liner layer 156 are formed from the inside to the outside. By the oxide liner layer 154 sandwiched between the nitride liners layers 152 and 156, the parasitic capacitance between the bit line 140' and the subsequently formed capacitor contact (not shown) may be prevented. In an alternative embodiment, the oxide liner 154 may also be replaced by an air gap.

Since the bit line 140' and the contact opening 120 use opposite mask patterns, the widths of the two are substantially the same. In other words, the sidewall of the spacer 136 is substantially level with the sidewall of the bit line 140'. Therefore, in FIG. 14, in the first direction of a cross-section taken along the first direction, it can be seen that the spacer 136 is at a position laterally within the dielectric liner 150.

The nitride liner layers 152 and 156 include silicon nitride while the oxide liner layer 154 includes silicon oxide. In some embodiments, the deposition process is similar to those described above, and thus will not be repeated here.

In a comparative embodiment, in order to form a spacer separated the contact from the capacitor contact, the following steps are needed. After forming the contact and the bit line, a trench is formed by additionally recessing outsides of the contact and the side surfaces of the contact are exposed due to the trench; an oxide layer is formed using an oxidation process; a nitride layer is formed on the oxide layer; the excessive nitride of the nitride layer is removed using phosphoric acid, and the remaining nitride of the nitride layer acts as spacers, and a dielectric liner is then formed. However, since the side surfaces of the contact are exposed during the above steps, the profile of side surfaces of the contact may be affected. Also, an additional oxidation process is used during the above steps, cost and the process complexity are increased. Furthermore, phosphoric acid used to remove excessive nitride may cause damage to the bit line (such as tungsten), thereby reducing the yield of the semiconductor memory structure.

In contrast, the dielectric liner 150 may be directly formed after the contact 134 and the bit line 140' are formed. Not only may the extra step of etching both sides of the contact be omitted, and thus the side surfaces of the contact 134 will not be exposed, but the step of the oxidation process may also be omitted, thereby simplifying the steps in the process and reducing the cost. Furthermore, since the spacers are formed before the contact is formed, it is not necessary to additionally use phosphoric acid to remove the excess nitride in order to form the spacers after the contacts are formed, thereby preventing conductive pattern 141' or 142' in the bit line 140' from being damaged.

Next, referring to FIGS. 15A-20A and FIGS. 15B-20B, the capacitor contact 170 may be formed on the semiconductor substrate 102 and on both sides of the bit line 140' to facilitate subsequent formation of capacitors (not shown). In some embodiments, the capacitor contact 170 includes conductive layers 172 and 176 and a silicide layer 174 disposed between the conductive layers 172 and 176.

It should be noted that there are no significant structural changes in the cross-sectional view of FIGS. 15B-20B, so the following description focus on the cross-sectional structure of FIGS. 15A-20A.

Figures 15A, 15B:
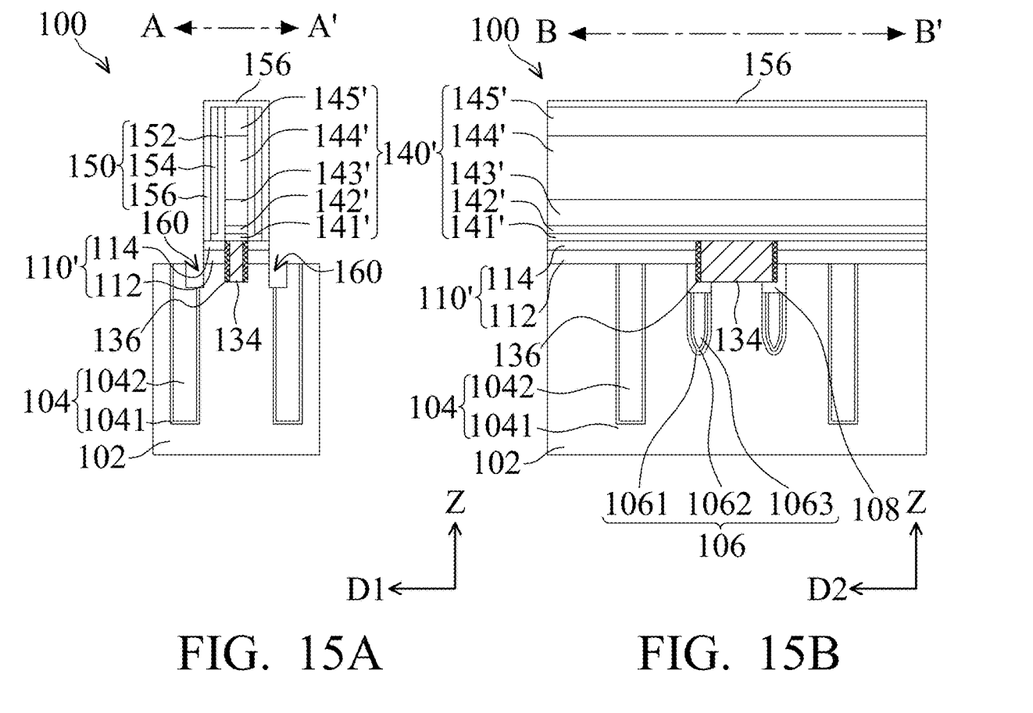

In FIG. 15A, the cap layer 110' and the semiconductor substrate 102 are recessed along the sidewalls of the dielectric liner 150 using an etch-back process to form an opening 160.

Figures 16A, 16B:
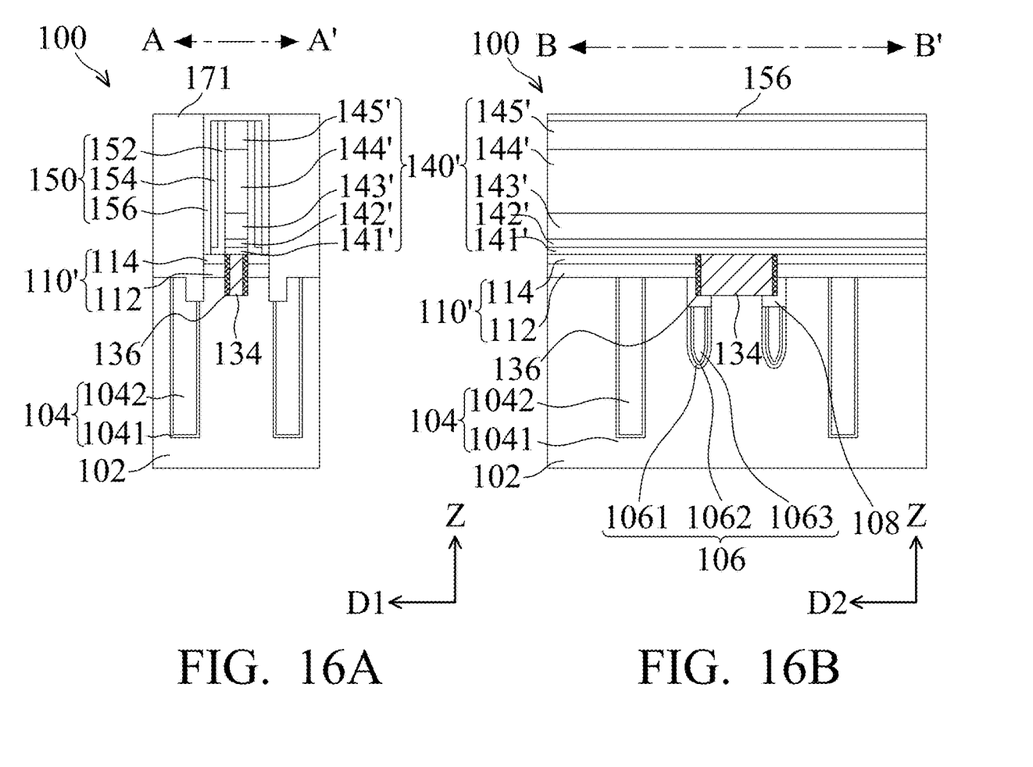

In FIG. 16A, a conductive material 171 is formed in the opening 160 and on the semiconductor substrate 102. The conductive material 171 includes doped polysilicon, metal, or metal nitride.

Figure 17A:
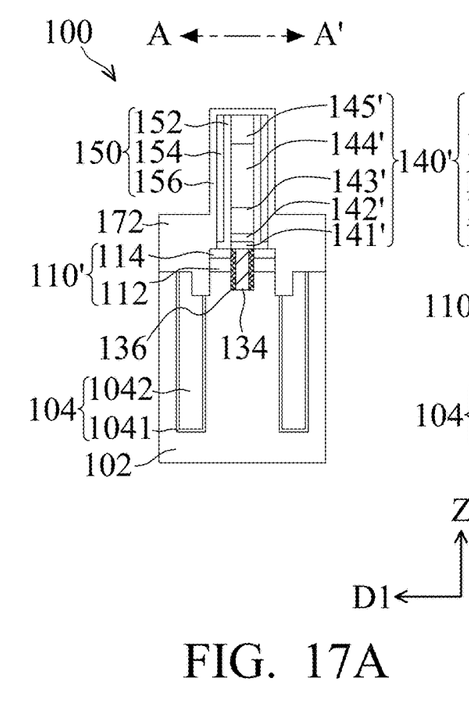
Figure 17B:
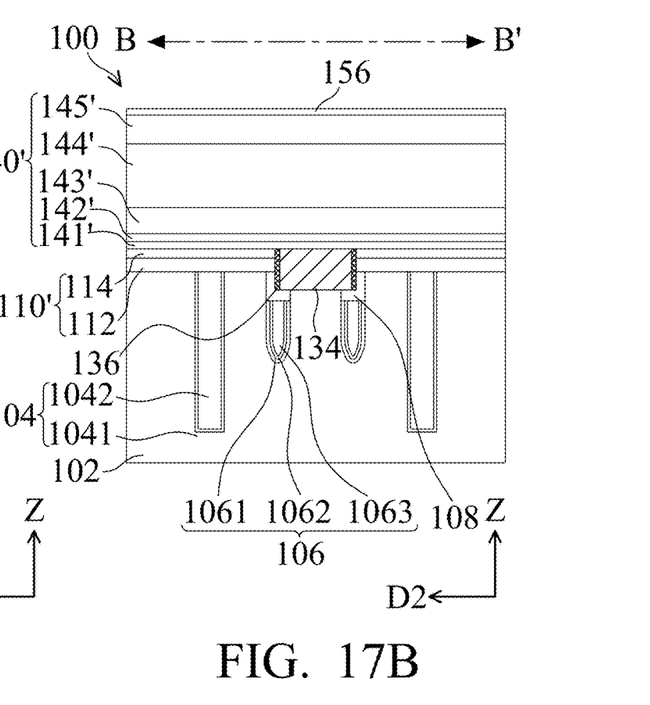
Figure 18A:
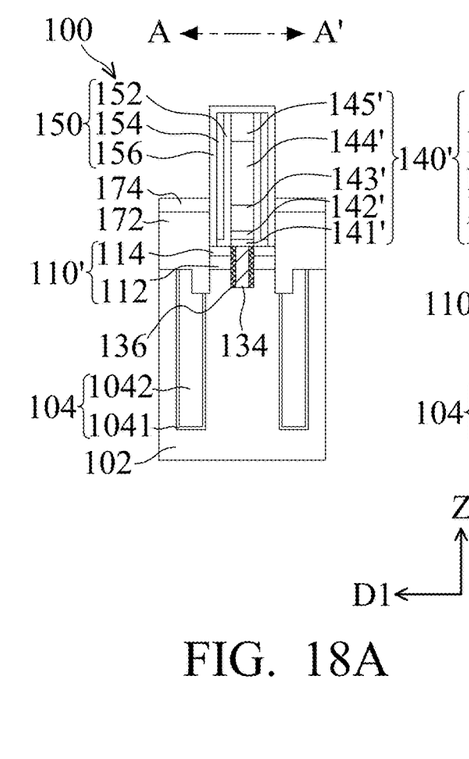
Figure 18B:
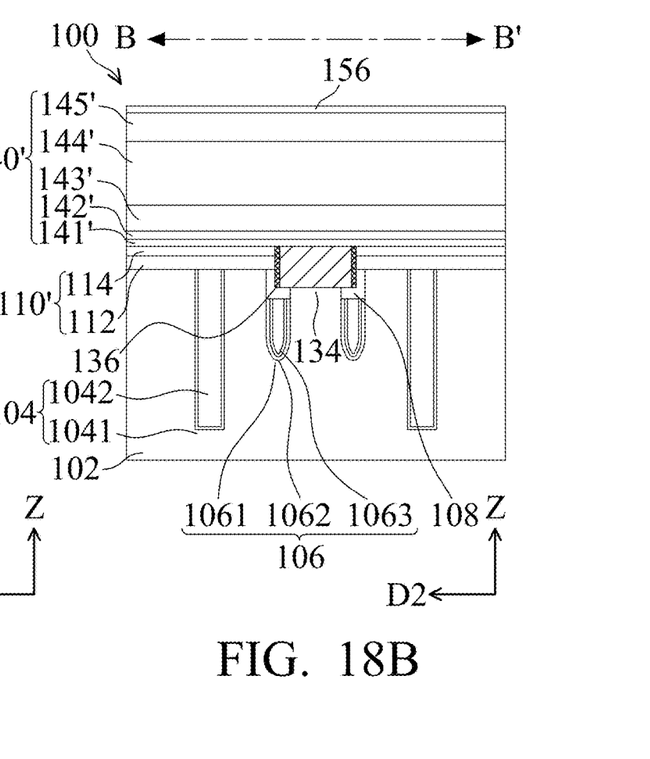

In FIG. 17A, the conductive material 171 is etched back to form a conductive layer 172. In FIG. 18A, a silicide layer 174 is formed on the conductive layer 172. The silicide layer 174 includes cobalt silicon (CoSi) to reduce contact resistance. The formation of the silicide layer 174 includes depositing a metal (such as cobalt) on the conductive layer 172, performing an annealing process to the metal, and then using a wet etching process to remove the unreacted portion of the metal to form the silicide layer 174.

Figures 19A, 19B:
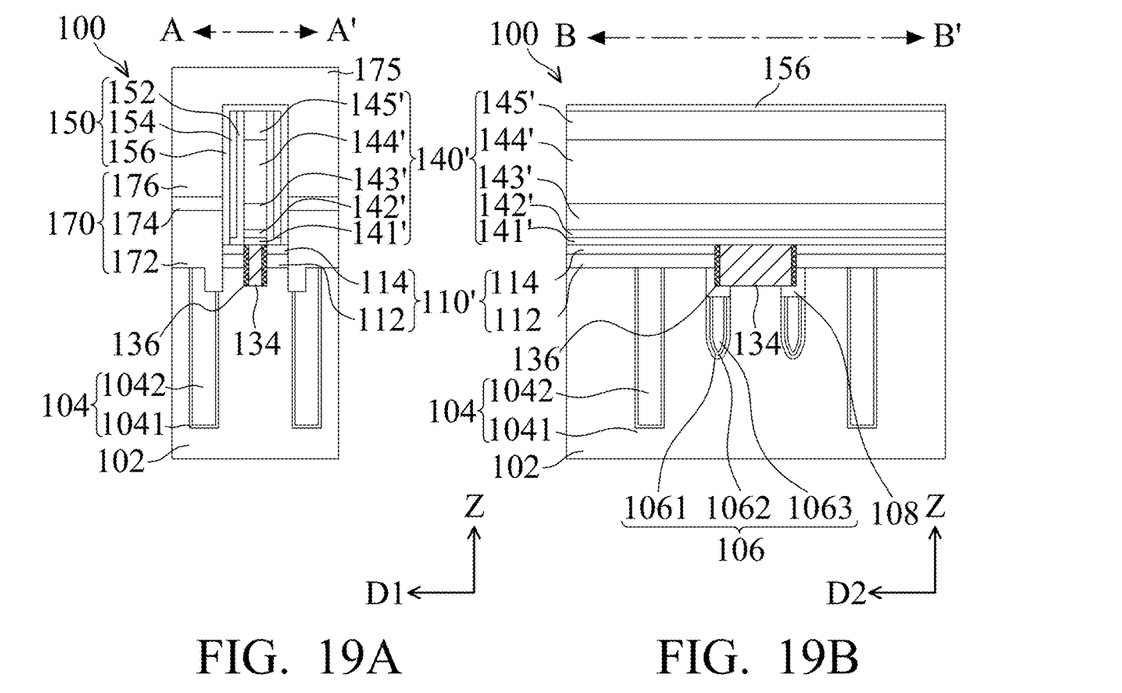
Figures 20A, 20B:
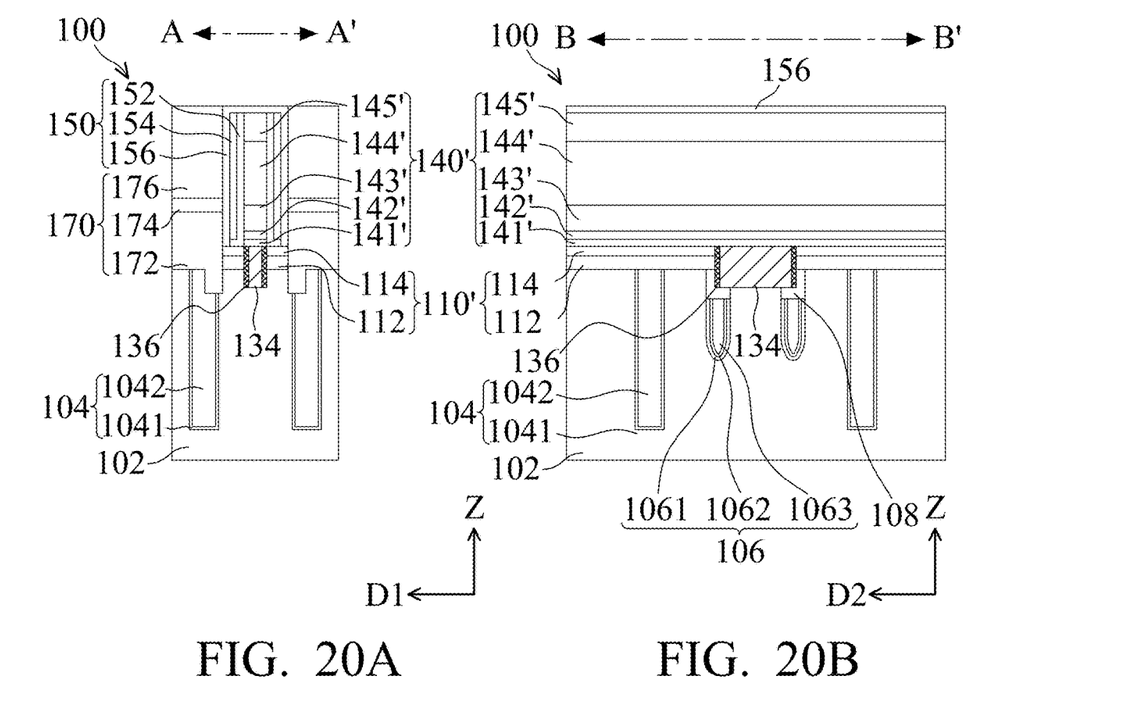

In FIG. 19A, a conductive material 175 is formed on the silicide layer 174. The conductive material 175 includes doped polysilicon, metal, or metal nitride. In FIG. 20A, the conductive material 175 is etched back to form a conductive layer 176.

As the contact 134 is centered, the spacer 136, the cap layer 110', and the capacitor contact 170 are disposed from the inside to the outside. In other words, the contact 134 is spaced laterally from the capacitor contact 170 by the spacer 136 and the cap layer 110' to avoid leaking current more effectively.

The semiconductor substrate 102 under the contact 134 has a doped region (not shown), which may be used as a source, and the semiconductor substrate 102 under the capacitor contact 170 has a doped region (not shown), which may be used as a drain. As shown in FIG. 8, in any of the active areas 102A extending in the third direction D3, the sequence of the arrangement is as follows: capacitor contact 170, word line 106, contact 134, word line 106, capacitor contact 170, which are used as a drain, a gate, a source, a gate, and a drain, respectively. In other words, two sets of transistor structures sharing the same source are included in the active region 102A. This way, the layout may be used more effectively, lowering manufacturing costs.

It should be understood that after the capacitor contact 170 is formed, additional elements, such as capacitors, metal layers, or the like, may still be formed to complete the formation of memory device (such as dynamic random access memory).

In summary, phosphoric acid causing damage to the bit line used to etch the spacers in the process of sequentially forming the contact, the bit line, and the spacer may be avoided by sequentially forming the spacer, the contact, and the bit line provided by the present disclosure. Sequentially forming the spacer, the contact, and the bit line provided by present disclosure may avoid the use of phosphoric acid to etch the spacers in the process of sequentially forming the contact, the bit line, and the spacer and thus prevent the bit line from being damaged. Also, the step of recessing the opening may be omitted. In addition, the spacers may isolate the contact and the capacitor contact more effectively. Therefore, the reliability and manufacturing yield of the semiconductor memory device are improved.

Although the present invention is disclosed in the foregoing embodiments, it is not intended to limit the present invention. Those with ordinary skill in the technical field to which the present invention pertains can make some changes and modifications without departing from the spirit and scope of the present invention. Thus, the scope of protection of the present invention shall be subject to those defined by the attached patent scope.

What is claimed is:

1. A method for forming a semiconductor memory structure, comprising:
   providing a semiconductor substrate, wherein a pair of word lines is embedded in an active region of the semiconductor substrate and extends in a first direction;
   forming a hard mask layer on the semiconductor substrate;
   forming a contact opening corresponding to the pair of word lines through the hard mask layer and a portion of the semiconductor substrate;
   forming a pair of spacers on sidewalls of the contact opening;
   filling the contact opening with a conductive material to form a contact;
   planarizing a portion of the hard mask layer and the conductive material to be coplanar after the step of filling the conductive material, wherein a remaining of the conductive material acts as the contact and a remaining of the hard mask layer acts as a cap layer;
   forming a bit line directly above the contact and the pair of spacers after the step of planarizing, wherein the bit line extends in a second direction that is perpendicular to the first direction; and
   forming a dielectric liner on sidewalls of the bit line.

2. The method as claimed in claim 1, wherein the semiconductor substrate further comprises an isolation region surrounding the active region, wherein in a cross-section taken along the first direction, the pair of spacers is disposed in the active region surrounded by the isolation region without extending over the isolation region.

3. The method as claimed in claim 1, wherein in a cross-section taken along the first direction, the contact is laterally spaced apart from the active region of the semiconductor substrate by the pair of spacers.

4. The method as claimed in claim 1, wherein the step of forming the dielectric liner comprises:
   conformally depositing a nitride material liner on the cap layer and sidewalls and a top surface of the bit line;
   conformally depositing an oxide material liner on the nitride material liner;
   etching back the nitride material liner and the oxide material liner, so that a top surface of a remaining of the nitride material liner, a top surface of a remaining of the oxide material liner, and a top surface of the bit line are level; and
   conformally depositing another nitride material liner on the cap layer, on the remaining of the nitride material liner, on the remaining of the oxide material liner, and on the bit line.

5. The method as claimed in claim 1, wherein sidewalls of the contact are not exposed after the step of forming the bit line and before the step of forming the dielectric liner.

6. The method as claimed in claim 1, wherein phosphoric acid is not used after the step of forming the bit line and before the step of forming the dielectric liner.

7. The method as claimed in claim 1, wherein the step of forming the spacers comprises:
conformally depositing a spacer material layer on the contact opening and on the hard mask layer by atomic layer deposition (ALD); and
anisotropically etching the spacer material layer on the hard mask layer and on a bottom of the contact opening to form the pair of spacers on the sidewalls of the contact opening.

8. A semiconductor memory structure, comprising:
a semiconductor substrate having an active region;
a pair of word lines embedded in the active region of the semiconductor substrate, wherein the pair of word lines extends in a first direction;
a cap layer disposed on the semiconductor substrate;
a contact penetrating through the cap layer, wherein a portion of the contact is disposed in the semiconductor substrate;
a pair of spacers disposed on sidewalls of the contact, wherein the pair of spacers corresponds to the pair of word lines;
a bit line extending in a second direction that is perpendicular to the first direction, wherein in a cross-section taken along the first direction, the bit line is disposed directly above the contact and the pair of spacers; and
a dielectric liner disposed on sidewalls of the bit line, wherein in the first direction of a cross-section taken along the first direction, the pair of spacers is at a position laterally within the dielectric liner.

9. The structure as claimed in claim 8, wherein in a cross-section taken along the second direction, the pair of spacers does not extend beyond outer edges of the pair of word lines.

10. The structure as claimed in claim 8, wherein in a cross-section taken along the second direction, the pair of spacers is disposed directly above the pair of word lines.

11. The structure as claimed in claim 8, wherein the semiconductor substrate further comprises an isolation region surrounding the active region, wherein in the cross-section taken along the first direction, the pair of spacers is disposed in the active region beside the isolation region without extending over to the isolation region.

12. The structure as claimed in claim 8, wherein in the cross-section taken along the first direction, the contact is laterally spaced apart from the active region of the semiconductor substrate by the pair of spacers.

13. The structure as claimed in claim 8, wherein in the cross-section taken along the first direction, a ratio of a width of the contact to a width of one of the pair of spacers is 2-10.

14. The structure as claimed in claim 8, wherein the pair of spacers is disposed on an entirety of the sidewalls of the contact.

15. The structure as claimed in claim 8, wherein a thickness of the pair of spacers in the first direction is the same as a thickness of the pair of spacers in the second direction.

16. The structure as claimed in claim 8, further comprising a protection layer disposed on the pair of word lines and below the cap layer, wherein in a cross-section taken along the second direction, the pair of word lines is spaced apart from the pair of spacers by the protection layer.

17. The structure as claimed in claim 8, wherein the dielectric liner comprises a pair of nitride liners and an oxide liner, wherein the oxide liner is sandwiched between the pair of nitride liners.

18. The structure as claimed in claim 8, further comprising a capacitor contact disposed on sidewalls of the dielectric liner and on sidewalls of the cap layer, wherein the contact is laterally spaced apart from the capacitor contact by the pair of spacers and the cap layer.

* * * * *